United States Patent [19]

Wojnarowski et al.

[11] Patent Number: 5,154,793
[45] Date of Patent: Oct. 13, 1992

[54] METHOD AND APPARATUS FOR REMOVING COMPONENTS BONDED TO A SUBSTRATE

[75] Inventors: Robert J. Wojnarowski, Ballston Lake; Charles W. Eichelberger, Schenectady, both of N.Y.

[73] Assignee: General Electric Company, Schenectady, N.Y.

[21] Appl. No.: 644,716

[22] Filed: Jan. 23, 1991

Related U.S. Application Data

[63] Continuation of Ser. No. 249,927, Sep. 27, 1988, abandoned.

[51] Int. Cl.⁵ .............................................. B32B 31/00
[52] U.S. Cl. .................................. 156/344; 156/229; 156/584; 228/264
[58] Field of Search ............... 156/344, 628, 584, 249, 156/556; 221/210; 271/33; 228/264

[56] References Cited

U.S. PATENT DOCUMENTS

| | | | |
|---|---|---|---|
| 3,094,323 | 6/1963 | Catania | 221/210 |
| 3,279,969 | 10/1966 | Borchardt | 156/249 X |
| 4,004,061 | 1/1977 | Creighton et al. | 156/283 X |
| 4,398,985 | 8/1983 | Eagon | 156/247 X |
| 4,436,242 | 3/1984 | Shisler et al. | 228/264 |
| 4,517,235 | 5/1985 | Ungar et al. | 156/230 X |
| 4,664,739 | 5/1987 | Aurichio | 156/344 |
| 4,759,816 | 7/1988 | Kasper et al. | 156/344 X |
| 4,775,438 | 10/1988 | Funakoshi et al. | 156/249 X |

*Primary Examiner*—David A. Simmons
*Assistant Examiner*—James J. Engel, Jr.
*Attorney, Agent, or Firm*—Marvin Snyder

[57] ABSTRACT

A method of removing components bonded to a substrate without damaging either the component-to-be-removed or adjacent components involves bonding a lifting member to an exposed surface of a component-to-be-removed with a bonding layer whose yielding temperature is above the yielding temperature of the bonding layer which bonds the component-to-be-removed to the substrate and then pulling the lifting member under conditions which cause the bond between the component and the substrate to yield. This component removal process enables post removal failure analysis to be performed on a faulty component and also allows a removed good component to be reused by preventing damage to the component being removed.

4 Claims, 4 Drawing Sheets

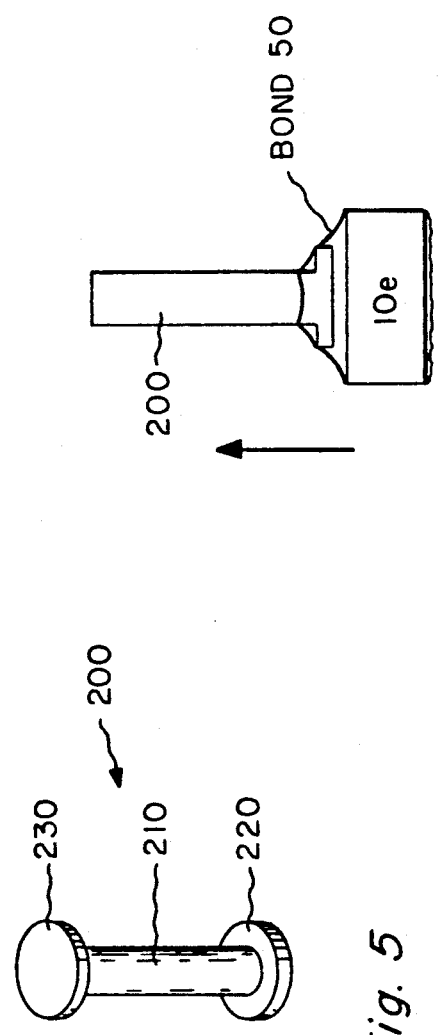
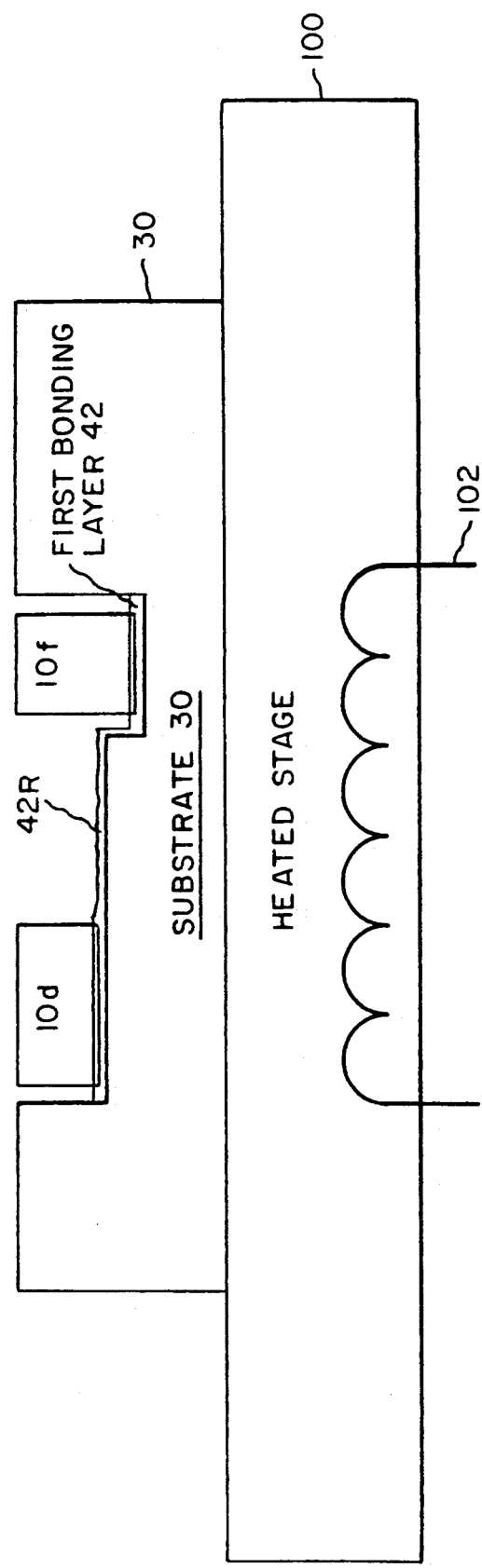

METHOD AND APPARATUS FOR REMOVING COMPONENTS BONDED TO A SUBSTRATE

This application is a continuation of application Ser. No. 07/249,927, filed Sept. 27, 1988 now abandoned.

CROSS REFERENCE TO RELATED APPLICATIONS

This application is related to the following applications and patents which are assigned to the same assignee and are incorporated herein by reference:

U.S. Pat. No. 4,714,516, issued Dec. 22, 1987, and entitled "Method to Produce Via Holes in Polymer Dielectrics for Multiple Electronic Circuit Chip Packaging" by Charles W. Eichelberger and Robert J. Wojnarowski;

U.S. Pat. application Ser. No. 912,456, filed Sept. 26, 1986, entitled "Multichip Integrated Circuit Packaging Configuration and Method" by Charles W. Eichelberger, Robert J. Wojnarowski and Kenneth B. Welles, II, now U.S. Pat. No. 4,783,695, issued Nov. 8, 1988;

U.S. Patent application Ser. No. 912,457, filed Sept. 26, 1986, entitled "Integrated Circuit Packaging Configuration for Rapid Customized Design and Unique Test Capability" by Charles W. Eichelberger, Kenneth B. Welles, II and Robert J. Wojnarowski;

U.S. Patent application Ser. No. 240,367, filed Aug. 30, 1988, as a continuation of application Ser. No. 912,458, filed Sept. 26, 1986, entitled "Method and Apparatus for Packaging Integrated Circuit Chips Employing a Polymer Film Overlay Layer" by Charles W. Eichelberger, Robert J. Wojnarowski and Kenneth B. Welles, II;

U.S. Patent application Ser. No. 230,654, filed Aug. 5, 1988, as a continuation of U.S. Patent application Ser. No. 912,454, filed Sept. 26, 1986 entitled "Method and Configuration for Testing Electronic Circuits and Integrated Circuit Chips Using a Removable Overlay Layer" by Charles W. Eichelberger, Robert J. Wojnarowski and Kenneth B. Welles, II; and U.S. Patent application Ser. No. 947,461, filed Dec. 29, 1986, entitled "An Adaptive Lithography System to Provide High Density Interconnect" by Charles W. Eichelberger, Robert J. Wojnarowski and Kenneth B. Welles, II, now U.S. Pat. No. 4,835,704, issued May 30, 1989.

BACKGROUND OF THE INVENTION

Field of the Invention

The present invention relates primarily to removal of components in electronic systems, and more particularly, to removal of components in high density systems in which individual components are bonded to a substrate with little separation between them, but has much broader application.

In the high density packaging system described and claimed in the above-identified related patents and applications, there is a need to be able to remove an individual component such as an integrated circuit chip from a substrate when that chip is surrounded by other chips which are positioned very close to it. As explained in application Ser. No. 912,456 cited above, these chips can be placed essentially edge-to-edge. For several reasons, the resulting narrow separations between adjacent chips make it impossible to effectively remove the chips by gripping their sides or prying them out with a lever. First, such actions are essentially certain to damage either the chip being removed or adjacent chips and more likely both. Second, a gripping tool or lever which has a thickness which is less than the separation between the chips is too weak or too flexible to be effective. Vacuum chucks and similar apparatus which is intended to lift and place unencumbered chips into packages or other mounting structures are ineffective for removing such chips because the relatively small surface area of such a chip (typically on the order of ¼ inch by ¼ inch or having a surface area of 1/16 of a square inch) severely limits the lifting force which can be provided by a vacuum under atmospheric conditions. Further, any technique which drills, breaks or chips the components is unacceptable because the resulting silicon dust, grains and chunks can contaminate other chips and interferes with mounting a replacement chip in place of the removed chip and prevents effective post-removal failure analysis of a removed chip.

Since the type of packaging disclosed in the above-identified related patents and applications is intended for use in high density, expensive systems in which high reliability is important, it is considered highly desirable, if not essential, that a defective chip, or one which has failed during use, can be removed in a manner which enables post-removal failure analysis of the chip to be conducted in a normal fashion. Therefore, the removed chip must not be damaged or destroyed during the removal process.

Consequently, there is a need for a component or chip removal method and apparatus which enables such chips to be removed without adversely affecting adjacent chips and without impairing the ability to conduct failure analysis on the removed chip in the event that the removed chip is a defective or faulty chip.

OBJECTS OF THE INVENTION

Accordingly, a primary object of the present invention is to provide a method of removing a chip via contact to its exposed surface only.

Another object is to provide a method of removing a chip in a manner which permits re-use of chips which were good prior to being removed.

Still another object of the invention is to remove chips, disposed with only narrow spaces between their sides and the sides of other chips, in a manner which is assured of not damaging any of the chips.

Yet another object of the present invention is to provide apparatus for removing chips in a non-destructive manner from close packed situations.

SUMMARY OF THE INVENTION

The above objectives are accomplished in accordance with the present invention by providing a nail-like lifting member having a "head" which is slightly smaller than the exposed surface of a component-to-be-removed. The lifting member is bonded to the exposed surface of the component-to-be-removed and then pulled under the conditions which result in the bond between the component-to-be-removed and the substrate yielding and thereby releasing the component from the substrate. In accordance with the invention, the lifting member may be bonded to the component in any appropriate manner.

In accordance with one embodiment of the invention, a first bonding layer such as an ULTEM ® polyetherimide resin as provided by General Electric Company secures the components to a substrate. This material has a yielding temperature (defined hereinafter in the Detailed Description portion of the specification) which is below about 250° C. A second bonding layer which may preferably comprise a polyether ether ketone such as PEEK ® as provided by ICI Americas Inc. which has a yielding temperature above about 340° C. is used to bond the lifting member to the component-to-be-removed. The bond between the lifting member and the component-to-be-removed may preferably be created by placing a preform of the second bonding layer material on the exposed surface of the component-to-be-removed, heating the substrate and the components thereon to a temperature in the vicinity of 270°-320° C. The first bonding layer of polyetherimide is sufficiently viscous under those conditions to hold all of the components in their pre-existing locations. The lifting member is then heated to a temperature which is sufficiently above the temperature of the substrate and the component-to-be-removed, that upon being pressed into the polyether ether ketone, enough heat transfers from the lifting member into the polyether ether ketone to raise its temperature to a level at which it wets both the lifting member and the surface of the component-to-be-removed. After this bond cools to a temperature in the range of 250°-300° C., the lifting member is pulled away from the substrate in a manner which causes the bond between the substrate and the component-to-be-removed to yield thereby releasing the component from the substrate.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 4 is a cross-section similar to FIG. 3, except illustrating the lifting member and the component-to-be-removed after yielding of the component/substrate bond and withdrawal of the component-to-be-removed from the substrate; and FIG. 5 illustrates an alternative lifting member configuration.

DETAILED DESCRIPTION

Figure 1:
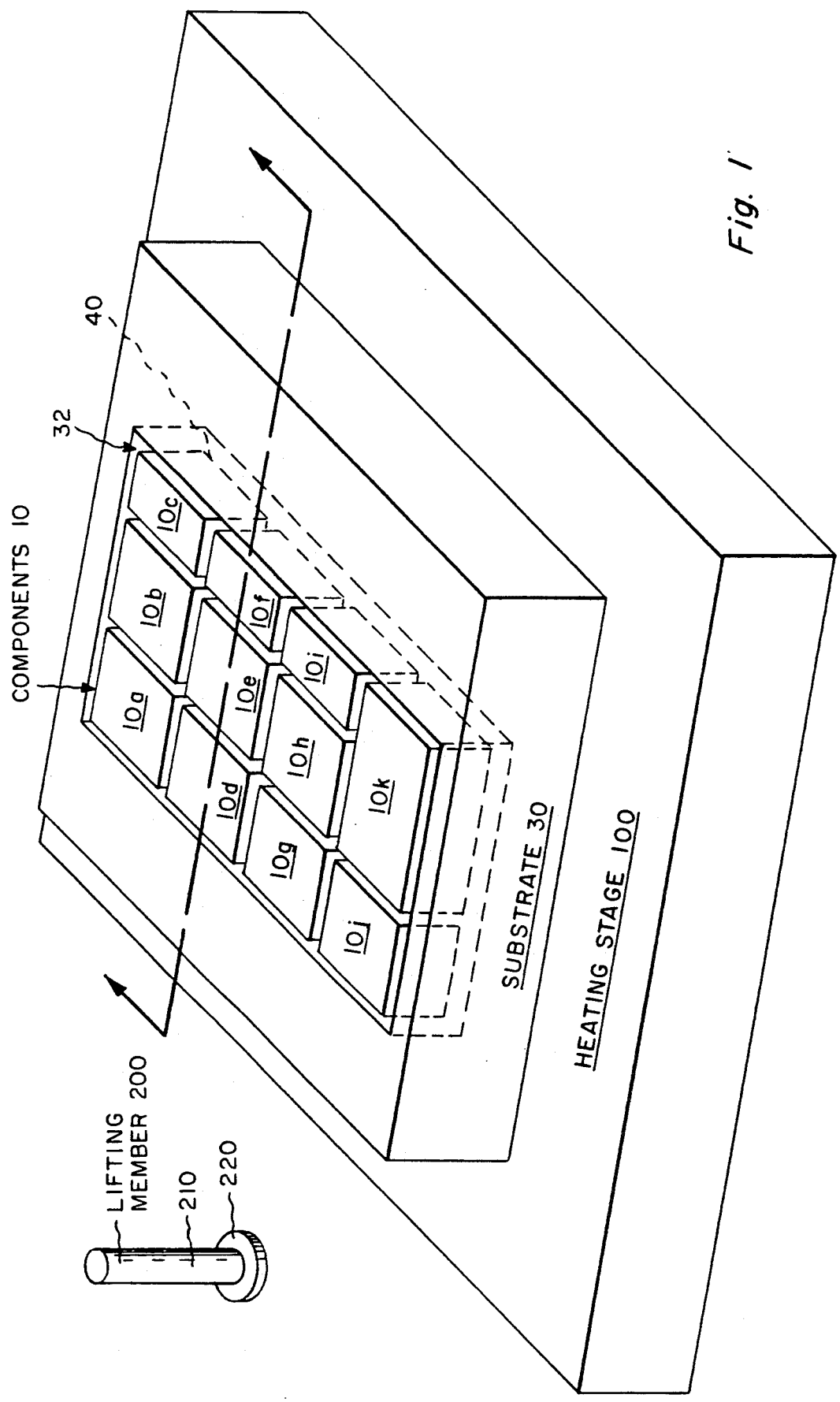
FIG. 1 is a perspective view of 11 closely packed components bonded to a substrate which is itself disposed on a heating stage in preparation for removal of a component.

Throughout this patent, the term "component" is used in a broad sense to include small parts of all kinds, as appropriate, including both mechanical and electrical parts, elements, support members and so forth. These components may include active electrical devices or components, passive electrical devices or components and electrically inert components and may include, without any limitation to these specific items, resistors, capacitors, inductors, magnets, semiconductor devices, integrated circuits, light emitting devices, light responsive devices, heaters, heat dissipation devices, support members, fasteners, magnetic, radiation or thermal shields and so forth. In a high density interconnect of the type described in the related patents and applications, the components are typically semiconductor chips and chip capacitors and chip resistors.

Not unlike the question of how many angels can dance on the head of a pin, discussions, arguments, analyses and disputes can go on endlessly about the details of the softening, melting, weakening, adhesion, de-adhesion, wetting, etc. conditions which are involved in the formation of or breaking of a bond between a component and either a lifting member or a substrate and the nature of the mechanisms which result in one bond being weaker than another bond so that the one bond yields before the other when under tensile stress. While the glass transition temperature Tg may be a reasonably accurate specification of this condition for some materials, either the melting point or the deflection temperature $T_D$ may be more accurate for other materials. Further, these and other terms are not always applied consistently in different disciplines and by different workers. Further, with respect to the breaking of a bond factors such as differences is viscosity of the bonding materials may be pertinent or controlling. Consequently, in order to minimize confusion, for the purposes of this patent we define "yielding conditions" as the externally applied conditions which result in a bond or bonding layer flowing, weakening, softening, wetting, adhering, de-adhering, separating and so forth. These "yielding conditions" may be determined merely by a "yielding temperature" or may, in addition, include the presence of solvents, the application of pressure, tension, low frequency or ultrasonic vibration and any other stimuli which may produce different degrees of bond strength diminishment in various bonds.

We define "bond strength" in terms of the results produced, rather than internal details of the bonds. Thus, where two bonds are placed under tensile strength, the bond which yields first is considered the weaker bond even if in fact, it has a smaller area with the result that on a per unit area basis, it might be a stronger bond. Yielding of a bond, such as the bond between a component-to-be-removed and a substrate may occur at a bonding layer/component interface due to reduced or inadequate adhesion, within the bonding layer itself due to reduced or inadequate cohesion or at a bonding layer/substrate interface due to reduced or inadequate adhesion or the bond may yield in a combination of these ways.

Figure 2:
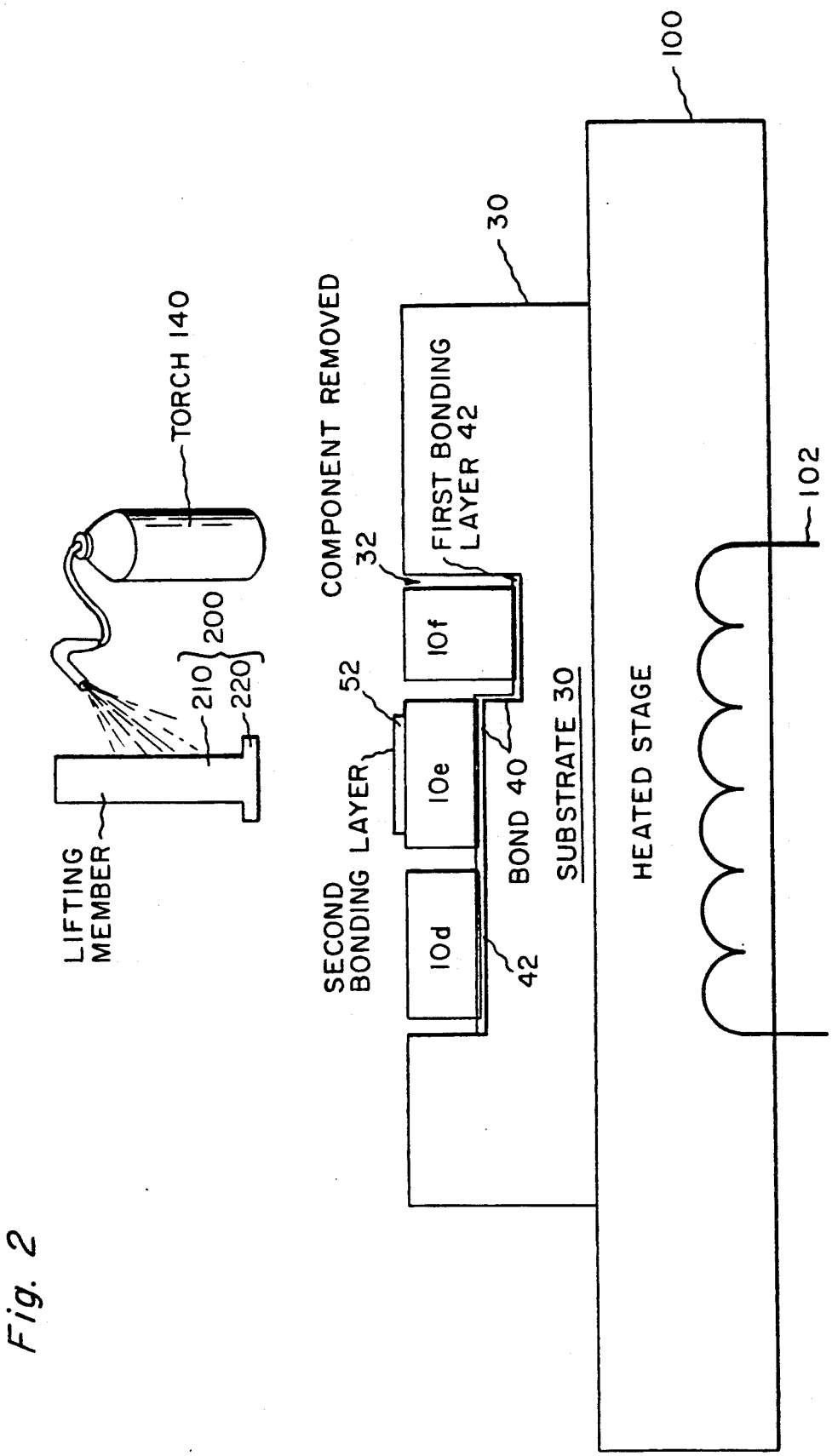
FIG. 2 is a cross-section through the structure of FIG. 1 taken along the line 2—2 and illustrating the bonding preform and lifting member prior to bonding of the lifting member to the component-to-be-removed.
Figure 3:
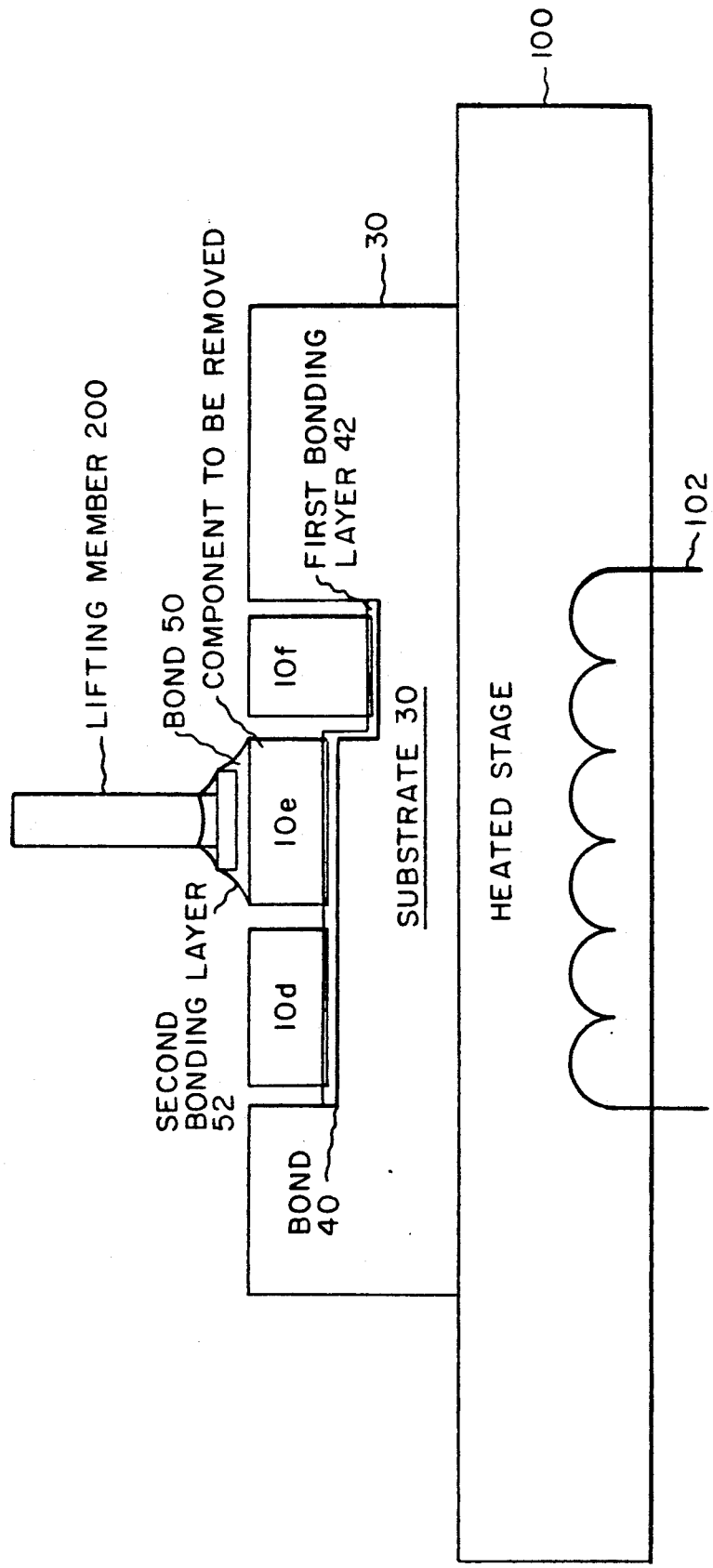
FIG. 3 is a cross-section similar to FIG. 2, except showing the lifting member bonded to the component-to-be-removed.

FIG. 1 illustrates in perspective view, a package or substrate 30 having a cavity or depression 32 therein in which a plurality of components 10a-10k are positioned with their lower surfaces bonded to the substrate 30 by a bond 40 comprised of a bonding layer 42 (shown in FIGS. 2-4).

The components 10a-10k may be positioned essentially edge-to-edge or further apart as is considered desirable. They are illustrated spaced apart for clarity of the illustrations. We have successfully used this technique with semiconductor chips which were spaced apart by as little as 1-15 mils. The narrowness of these spaces between adjacent chips can be appreciated from the fact that a sheet of 20 lb. bond paper (the type normally used in photocopiers) typically has a thickness of slightly less than 4 mils. Thus, at a spacing of 1 mil, the space is one quarter of the thickness of one sheet of 20 lb. bond paper and at 15 mils, the spacing is essentially the thickness of four sheets of 20 lb. bond paper.

In FIG. 1, the substrate 30 is shown disposed on a heating stage 100 in preparation for removal of a component-to-be-removed 10e. A lifting member 200 is shown positioned to the side of the heating stage 100. Lifting member 200 has a shank 210 and a head 220.

Components 10 are preferably bonded to the substrate 30 by a polyetherimide resin such as ULTEM 6000® sold by General Electric Company. This polyetherimide is a thermoplastic. The following method may be used to initially bond the components to the substrate. The ULTEM 6000® polyetherimide resin is dissolved in an appropriate mixture of solvents such as methylene chloride, N-methyl pyrollodone, anisole, acetophenone, meta-cresol and so forth. One solvent mixture which we have found successful is 80 grams of ULTEM 6000® pellets, 64 grams of meta-cresol and 256 grams of orthodichlorobenzene (ODCB). This mixture is heated to a temperature of 100° C. and rolled on a roll mill until the mixture is in solution. This mixture is 16% meta-cresol. The meta-cresol content can be varied between about 12% and 20% to vary the characteristics of the solution. This solution may be applied to the substrate during bonding by wet spraying, by way of injection applicators and other means. While the resulting layer is still wet, the components to be bonded to the substrate are placed on the adhesive layer using hand placement or a pick and place machine to place them in their desired locations. This adhesive layer is sufficiently viscous that components, once placed, remain in place. After all of the components have been placed, the substrate with the wet adhesive layer and the components thereon is dried by appropriate heat treatment such as placing the substrate on a heated stages for 10 minutes at a temperature of 100° C., followed by 20 minutes at 150° C., in turn, followed by 20 minutes at 300° C. At the end of this time, all of the solvent has been driven off and the components are securely bonded to the substrate. At that point, the substrate and the components thereon are ready for whatever future use is intended for them. As may be seen more clearly in FIGS. 2-4, the substrate 30 preferably has a depression or cavity 32 within which the components are disposed so that their upper surfaces are in substantially a common plane with the upper surface of the substrate. The bottom of the cavity or depression is preferably contoured in accordance with the thickness of the individual components and is deeper at the location of a thick component such as 10f.

When the substrate is intended for use in the high density packaging structure which is the subject of the above-identified related patents and patent applications, this further use involves bonding a polymer film overlay across the components as disclosed in U.S. Pat. No. 4,783,645, cited above. After a polymer layer is bonded to the components, via holes are formed in that polymer layer either in accordance with U.S. Pat. No. 4,714,516 and the adaptive lithography U.S. Pat. No. 4,835,704, both cited above or in any other appropriate manner. While the via holes could be formed before lamination, it is preferred to wait until after lamination to ensure accurate alignment of the via holes with respect to the connection pads on the components or other features of significance to via hole alignment. A pattern of metal conductors is then formed on top of the polymer layer with contacts at appropriate locations to connect, via the via holes formed thereover, to the various connection pads of the components which are bonded to the substrate in order to interconnect the components into the desired circuit or system.

During subsequent testing of the resulting electronic system, it may be determined that one or more of the components 10 is inoperative, intermittent, out of specification or otherwise fails to function properly. Such a component is often referred to as a "bad component". Under those circumstances, the overlayer can be removed. It is then desired to remove the bad component from the substrate and replace it with a good component. The prior art provides no effective technique for accomplishing this component removal in a manner which enables effective postremoval failure analysis. Post-removal failure analysis is considered critical to establishing the cause of failure in bad components in order that the cause of the failure can be corrected and prevented from recurring in future similar components.

Alternatively, it may be desired to remove a good, operative component for reuse. This is especially so when the initial interconnection of components is a test connection. Such a test connection may involve a number of components which together comprise a reusable test system which are mounted on the substrate in a manner to enable the components-to-be-tested to be added to the substrate in appropriate locations, interconnected with the test system by an overlay metallization system for test purposes and then removed after completion of the testing for use in a final product system in which they are mounted on a different substrate. As a further alternative, the test system chips can be removed and reused to test other systems. This type of test system is taught and discussed in more detail in application Ser. No. 912,457, cited above. Again, the prior art provides no component removal technique for such closely spaced components which is capable of routinely removing good components for reuse without damaging the components being removed or the adjacent components which would remain bonded to the substrate in the above structure. One of the problems with prior art removal techniques such as prying, lifting with tweezers and so forth is that as the size of a semiconductor chip to be removed increases, there is a substantial increase in the danger of cracking the chip by uneven application of force to a chip which is strongly enough adhered to the substrate. The prior art has provided no solution to this problem.

In accordance with the present invention, good components, bad components or both may be removed from a substrate to which they are bonded without any damage either to the component(s)-to-be-removed or adjacent components which are not to be removed. As shown in FIG. 2, a second layer 52 of bonding material is disposed on the exposed upper surface of the component-to-be-removed 10e. The entire substrate 30 and its bonded components 10 are preferably placed on the heated support stage 100 which is heated by a heater 102 to an appropriate temperature for the process to be discussed directly hereinafter. When the bonding layer 52 is a polyether ether ketone such as PEEK® (a thermoplastic), that appropriate temperature is preferably in the range of 270°-300° C. or more. The lifting member is then (1) heated, as by a torch 140 or other heating mechanism, to an elevated temperature which is preferably in excess of 550° C., (2) positioned over the component 10e in a head-down orientation and (3) pressed into the bonding layer 52. With the bonding layer 52 already at a temperature of 270°-300° C., the lifting member 200 has a sufficient heat capacity at the temperature at which it is maintained prior to being pressed into layer 52, that it heats the bonding layer 52 to a high enough temperature to cause the bonding layer to yield sufficiently to cause a substantial drop in the viscosity of the polyether ether ketone so that it wets both the head 220 of the lifting member 200 and the upper surface of the component 10e as shown in FIG. 3. Polyether ether ketone adheres to most surfaces without the use of any primer. Consequently, it adheres to both the head of the lifting member and the upper surface of the component 10e. As the lifting-member/component combination cools, the bonding layer 52 resolidifies and forms a strongly adherent bond 50 between the lifting member 200 and the component 10e. During the process of bonding the lifting member to the component 10e with a polyether ether ketone bonding layer which has a yielding temperature in excess of 340° C., the various components 10 do not shift position despite the fact that the bonding layer 42 is held at a temperature above its yielding temperature. This is because of the thixotropic nature of the bonding layer 42 which, under these conditions, acts as a high viscosity material to hold the components in place despite being hotter than its yielding temperature. Once the bonding layer 52 has cooled to a temperature which is substantially less than its yielding temperature, such as a temperature in the case of PEEK in the neighborhood of 250°-270° C., the lifting member 200 is pulled upward or withdrawn from the substrate 30. This places a tensile stress on the lower bond 40 between the substrate and the lower surface of the component-to-be-removed, which is comprised of the bonding layer 42 and on the upper bond 50 between the lifting member 200 and the upper surface of the component-to-be-removed 10e which is comprised of the bonding layer 52. This pulling or withdrawal of the lifting member is performed under conditions in which the upper bond 50 is stronger than the lower bond 40 with the result that the lower bond 40 yields, thereby releasing the component 10e which is then carried away from the substrate 30 by the lifting member 200. This is shown in FIG. 4. Thus, the component-to-be-removed is removed without the use of any mechanical gripping of the component.

One of the advantages of this method of removing a chip or other component is that a substantially uniform lifting force is applied across the entire upper surface of the chip or component-to-be-removed. Consequently, the risk of cleaving, breaking or shattering a thin, brittle silicon chip is greatly reduced as compared to systems which apply the force to a limited area of the chip or component.

The head 220 of the lifting member 200 may be round, square, hexagonal or any other suitable shape. The "top" of the head which is disposed toward the surface of the component is preferably flat, but could be shaped to match a particularly irregular surface of a component. It is preferred that the head 220 be smaller than the top of the component-to-be-removed to ensure that it does not push or extrude the bonding layer 52 over any adjacent components or bond to them.

The lifting member may be formed of any material which is sufficiently strong at the temperatures of use and which does not introduce deleterious materials into the environment of the components. Appropriate materials include carbon, stone, metal, glass, ceramics and so forth.

The lifting members 200 may be inexpensive, throw away items or may be more permanent parts of a component removal machine. Different sizes and lengths of lifting members may be provided and used in accordance with the size and location of a component-to-be-removed.

Lifting members may be double headed as shown by member 200' in FIG. 5 which includes a second head 230. This second head ensures that an appropriately designed component removal machine can obtain a reliable, strong grip on the lifting member.

While the substrate 30 is illustrated as having a solid lower surface, it should be understood that it can include a hole or holes under each component in order to prevent a vacuum from developing as the component-to-be-removed is lifted off. Also, if desired, such a hole can be used to insert a rod to push a sufficiently durable component off the substrate.

After removal of the component-to-be-removed, any residual adhesive, such as adhesive 42R (FIG. 4), present where the component was bonded to the substrate can be removed by scraping, as with dental tools. The substrate is then ready for the application of a new adhesive layer in the vacancy left by the removed component. Thereafter, a new component is placed in that location and bonded in the same manner as discussed above.

As an alternative technique for lifting the component-to-be-removed, the substrate, component-to-be-removed and the lifting member bonded to it may be cooled to less than the yielding temperature of the lower bonding layer 42 and a solvent applied to dissolve the bonding layer 42. When the layer 42 has softened sufficiently, the lifting member is pulled to remove the component-to-be-removed. Thereafter, the solvent is dried from any remaining adhesive and a new component is installed in place of the removed bad component.

While the above description describes and the drawings show the removal of a single component, if it is desired to remove two or more components at one time, separate lifting members may be bonded to each of the components-to-be-removed or a single lifting member may be designed to be bonded to more than one of the components to be removed. This one-lifting-member-for-two-components removal is easier in the situation where two components-to-be-removed are disposed directly adjacent to each other, but may also be done where the components-to-be-removed are spaced apart.

In order that a replacement component may be substituted for the component which has been removed, it is preferred that the yielding of the lower bond 40 not involve a separation within either the component or the substrate. However, if it were desired to do so, either the component or the substrate could be designed to separate internally under these conditions.

In order to perform failure analysis on a bad component, the polyether ether ketone which bonds the lifting member to the component may be dissolved in concentrated sulfuric acid, provided the component itself is not attacked by sulfuric acid. Typically, semiconductor devices and integrated circuits (ICs) are not attacked by sulfuric acid. Once the polyether ether ketone has been dissolved, the bad component or chip is again in the condition in which it was while bonded to the substrate and may be subjected to whatever failure analysis procedures are considered desirable. The fact that the component removal process does not damage the component-to-be-removed is of great benefit in allowing failure analysis to be performed to determine the cause of component failures and thereby enable the component failures to be prevented in future production of such components. This is particularly important, where the components are expensive and time consuming to produce as is often the case with integrated circuits of the type which are likely to be incorporated in high density interconnect packages. The lack of damage is even more significant where it is desired to remove a good component for reuse. This reusability of the removed component is unique to this technique for removing closely-spaced surface mounted chips.

While this invention has been shown and described in terms of the use of an ULTEM ® polyetherimide resin as the first bonding layer holding the components to the substrate and use of a polyether ether ketone such as PEEK ® as the second bonding layer securing the lifting member to the component-to-be-removed, it should be understood that many other bonding materials may be used as is appropriate to the substrate, components and lifting member. Other polymer materials may be used for either bond. Further, this removal technique is not restricted to situations where the components are bonded to the substrate with polymer layers. It is also applicable to the removal of components which are solder-bonded to a substrate. The removal of a solder-bonded component presents some problems when adjacent components are bonded to the substrate by the same solder layer. If the entire solder layer is heated to above its yielding temperature, the other components will tend to shift as the component-to-be-removed is lifted from the substrate both due to the surface tension in the solder which tends to distort the solder layer as the component-to-be-removed is lifted and because of a tendency of the components to float on the solder. This problem can be overcome or avoided by keeping the substrate at a temperature below the yielding temperature of the solder and bonding the lifting member to the component-to-be-removed with a bonding layer which can be heated to bond the lifting member to the component without transferring sufficient heat to the underlying solder layer to cause the solder layer to melt to an extent which allows adjacent components to shift. Thereafter, the substrate and components thereon are preferably heated to slightly below the yielding temperature of the solder and additional heat is provided to the solder layer under the component-to-be-removed by supplying heat to the lifting member to heat the component-to-be-removed sufficiently to melt the solder layer thereunder without melting enough of the solder layer under any adjacent component to allow the adjacent component to move. The lifting member is then withdrawn carrying the component-to-be-removed with it. Thereafter, a replacement component with an appropriate quantity of solder on its lower surface may be inserted in place of the component which was removed and soldered in place either by heat supplied through the replacement component or by heating the entire substrate and the components thereon to above the yielding temperature of the solder, since with the replacement component in place, the tendency of other components to shift is minimized.

Other bonding materials such as other thermoplastics such as polyimide siloxanes; thermosetting materials, such as epoxys including those which cure at room temperature; diffusion bonds or other bonding agents may be used to provide the bond between the lifting member and the component-to-be-removed. The use of thermosetting materials carries with it the disadvantage that a relatively long time (usually half an hour to several hours) is required in order to form the bond between the lifting member and the component-to-be-removed. On the other hand, the use of thermosetting materials has the advantage that many thermosetting materials, once set, have a yielding temperature in the vicinity of 500°–800° C. with the result that such a bond ensures that when the lifting member is pulled from the substrate with the substrate at a temperature above the yielding temperature of the bonding layer which holds the component in place, the bond between the component and the substrate will yield rather than the bond between the lifting member and the component-to-be-removed yielding. Those of skill in the art will be able to select appropriate materials for bonding the lifting member to the component-to-be-removed in accordance with the characteristics of the component-to-be-removed, the substrate and the bonding layer which holds the component-to-be-removed to the substrate. An alternative material to polyether ether ketone for the bonding layer holding the lifting member to the component-to-be-removed is polyether sulfone which is sold under the trademark VITREX by ICI Americas, Inc., Wilmington, Del.

A bonding layer 52 bonding the lifting member to the component-to-be-removed may be used under selected circumstances even if its yielding temperature is lower than the yielding temperature of the bonding layer holding component to the substrate. This is possible, where the lifting member is employed to provide cooling to the bonding layer 52 to cool it to or keep it at a temperature below its yielding temperature while the bonding layer 42 holding the component to the substrate, is held at or heated to a temperature above its yielding temperature. A significant temperature difference can be established between the temperature of the bonding layer 42 and the temperature of the bonding layer 52 by application of heating or cooling to the lifting member because there is relatively little convection heating or cooling between the two bonding layers because of the close spacing of the components on the substrate.

While this invention has been disclosed and discussed in terms of its use for removing components from a substrate, it should be noted, that the same process can, if desired, be used to position components on a substrate prior to bonding them to the substrate. In that use of the process, the bonding layer 52 holding the lifting member to the chip is chosen to have a lower yielding temperature than the bonding layer which will bond the component to the substrate. In that way, after the bond between the substrate and the component has been established, yielding conditions can be applied to the bond between the lifting member and the component to remove the lifting member from the component without disturbing the bond between the component and the substrate. Further, if desired, the lifting member may be left in place on the component as a heat conductor or heat sink. Lifting members may also be bonded to some or all of the components 10 for the purpose of heat conduction rather than for component removal. Such members may be individually bonded, gang bonded, or may even comprise larger bodies having individual "feet" or a flat surface configured to be bonded to the components.

Where individual "heat sink" members having long shanks are bonded to components to be left in place, it is preferred that the shank have a weak point near the component so that sidewise or upward force which may accidentally be applied to the shank will bend or break the shank without damaging the component. Alternatively, a pliable bonding layer can be employed to provide this strain relief.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of removing, from a substrate, a component which is bonded to said substrate by a first bonding layer comprising a first bonding material, said method comprising:

bonding a lifting member to an exposed surface of said component with a second bonding layer comprising a second bonding material by:

placing a preform of said second bonding material on said exposed surface of said component, heating said substrate, component and preform to a first elevated temperature at which said first bonding layer is stable, heating said lifting member to a second elevated temperature higher than said first elevated temperature, pressing said heated lifting member into said heated preform while said lifting member is at a temperature above said first elevated temperature to further raise the temperature of said preform to cause said preform to wet said exposed surface of said component and said lifting member, and allowing said lifting-member/second-bondinglayer/component combination to cool to a temperature at which said second bond is stronger than said first bond; and pulling on said lifting member to lift said component of said substrate under conditions which result in said first bond yielding to release said component substrate.

2. The method recited in claim 1 wherein:
said pulling step is performed before said component-/substrate combination cools to ambient temperatures following the step of bonding said lifting member to said component.

3. The method recited in claim 1 wherein:
said second bonding layer has a higher yielding temperature than said first bonding layer.

4. The method recited in claim 3, wherein said step of pulling is performed under conditions in which said first bonding layer is at a temperature above its yielding temperature and said second bonding layer is at a temperature below it yielding temperature.

* * * * *